(12) United States Patent
Welchko et al.

(10) Patent No.: US 7,723,946 B2
(45) Date of Patent: May 25, 2010

(54) METHOD AND SYSTEM FOR PULSE POSITION SCHEDULING IN ELECTRIC DRIVES

(75) Inventors: Brian A Welchko, Torrance, CA (US); Steven E. Schulz, Torrance, CA (US); Silva Hiti, Redondo Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 421 days.

(21) Appl. No.: 11/736,687

(22) Filed: Apr. 18, 2007

(65) Prior Publication Data

US 2008/0258673 A1 Oct. 23, 2008

(51) Int. Cl.
*H02P 27/04* (2006.01)

(52) U.S. Cl. .................. 318/811; 318/810; 318/807; 318/767; 318/727

(58) Field of Classification Search .................. 318/811, 318/810, 807, 767, 727
See application file for complete search history.

(56) References Cited

U.S. PATENT DOCUMENTS

| | | | | |
|---|---|---|---|---|
| 5,706,186 A | * | 1/1998 | Blasko | 363/41 |
| 5,736,825 A | * | 4/1998 | Kaura et al. | 318/599 |
| 6,023,417 A | * | 2/2000 | Hava et al. | 363/41 |
| 6,819,078 B2 | * | 11/2004 | Ho | 318/808 |
| 7,190,143 B2 | * | 3/2007 | Wei et al. | 318/606 |

* cited by examiner

*Primary Examiner*—Walter Benson
*Assistant Examiner*—David S Luo
(74) *Attorney, Agent, or Firm*—Ingrassia Fisher & Lorenz, P.C.

(57) ABSTRACT

Method and system are provided for controlling an alternating current (AC) motor via an inverter. The method includes selecting a pulse sequencing method based on a modulation index of the inverter, and providing a voltage to the AC motor based on the pulse sequencing method. The system includes an inverter having a modulation index ($M_i$) and a controller coupled to the inverter. The controller selects a pulse sequencing method based on $M_i$ and produces a signal based on the pulse sequencing method. The inverter includes a switch network producing a voltage in response to the signal, and the voltage drives the AC motor.

18 Claims, 5 Drawing Sheets

FIG. 4 V₀ CENTER ACTIVE

FIG. 5 V₇ CENTER NULL

FIG. 6 V₀ CENTER NULL

FIG. 7 V₇ CENTER ACTIVE

| SECTOR | RPL | CAV | CNV |
|--------|-----------------|-----------------|-----------------|
| ONE | 1-2-7-7-2-1 | 7-2-1-1-2-7 | 1-2-7-7-2-1 |
| TWO | 0-3-2-2-3-0 | 0-3-2-2-3-0 | 2-3-0-0-3-2 |
| THREE | 3-4-7-7-4-3 | 7-4-3-3-4-7 | 3-4-7-7-4-3 |
| FOUR | 0-5-4-4-5-0 | 0-5-4-4-5-0 | 4-5-0-0-5-4 |
| FIVE | 5-6-7-7-6-5 | 7-6-5-5-6-7 | 5-6-7-7-6-5 |
| SIX | 0-1-6-6-1-0 | 0-1-6-6-1-0 | 6-1-0-0-1-6 |
*FIG. 9*
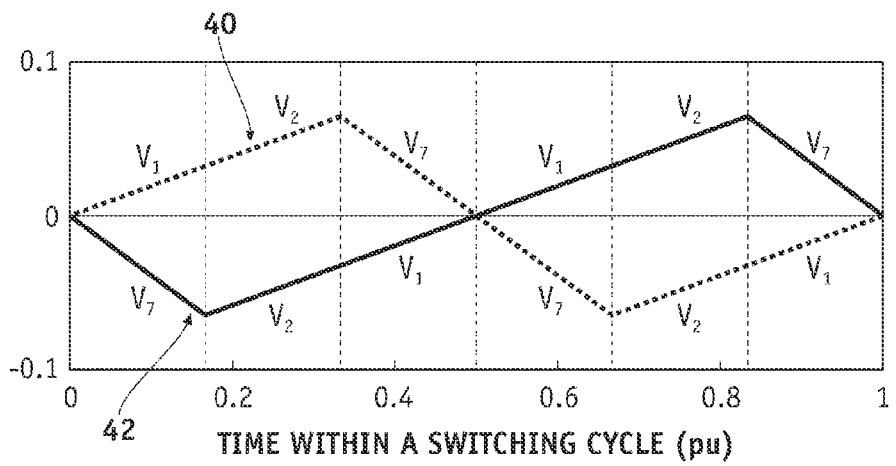
*FIG. 10*
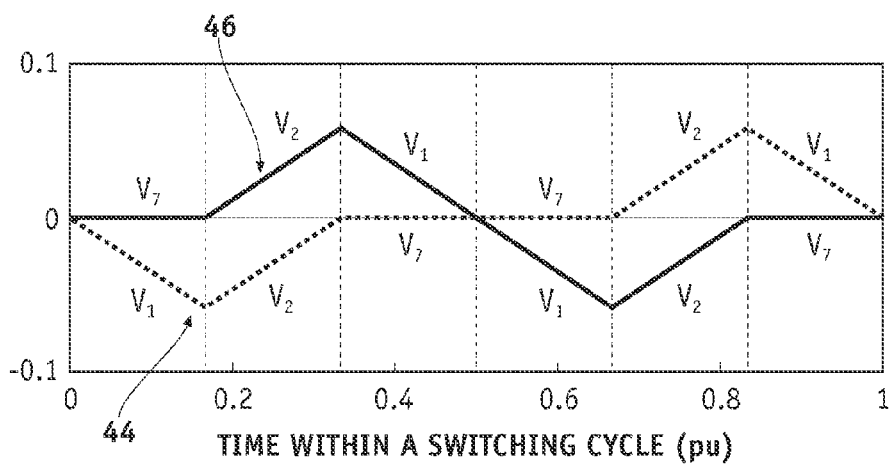
*FIG. 11*

METHOD AND SYSTEM FOR PULSE POSITION SCHEDULING IN ELECTRIC DRIVES

TECHNICAL FIELD

The present invention generally relates to controlling electric drives, and more particularly relates to a system and method for pulse position scheduling in electric drives.

BACKGROUND OF THE INVENTION

Electric drives, such as AC motors used in vehicle applications, are typically controlled via a voltage source inverter system. Discontinuous Pulse Width Modulation (DPWM) methods are commonly employed to control the fundamental output voltage component of three phase voltage source inverters. These three-phase voltage source inverters may in turn be used to control the phase currents of three phase AC motors. DPWM methods typically reduce inverter losses in comparison with continuous Pulse Width Modulation (PWM) methods, such as sinusoidal or space vector modulation.

DPWM methods generally differ from continuous PWM methods in that DPWM methods use a single zero vector in a given switching cycle of the three phase voltage source inverter. Additionally, in most DPWM methods, each switch of the three phase voltage source inverter is closed, or clamped, for sixty-degree (60°) segments of a switching cycle. The location of the sixty-degree (60°) clamped segment, with respect to the output voltage of the three phase voltage source inverter and the load power factor, generally determines the type of DPWM method and resulting PWM properties.

PWM techniques typically contribute a ripple current to the motor currents. In conventional voltage source inverters, the actual applied output voltage of the voltage source inverter includes an AC component resulting from the PWM action. This AC component is composed of harmonic voltages corresponding to each state of the PWM pulse sequence and may be a source of errors in the sampling instant of the motor drive. For example, inverter dead-time is typically selected to account for variations in temperature and component tolerances. As a result, the actual switching instant for the voltage source inverter is not necessarily constant and may shift in time and manifest as if the sampling instant is in error (e.g., a measurement error).

Accordingly, it is desirable to provide a method and system for controlling an electric drive that reduces current sampling errors. Additionally, it is desirable to provide a method and system for controlling an electric drive to improve torque accuracy. Furthermore, other desirable features and characteristics of the present invention will become apparent from the subsequent detailed description and the appended claims, taken in conjunction with the accompanying drawings and the foregoing technical field and background.

SUMMARY OF THE INVENTION

In an exemplary embodiment, a method for controlling an alternating current (AC) motor via an inverter is provided and includes selecting a pulse sequencing method based on a modulation index of the inverter, and providing a voltage to the AC motor based on the pulse sequencing method.

In another exemplary embodiment, a system for controlling an AC motor includes an inverter configured to couple to the AC motor, and a controller coupled to the inverter. The inverter has a modulation index and comprises a switch network configured to provide a voltage to the AC motor in response to a signal. The controller is configured to select a pulse sequencing method based on the modulation index and is further configured to produce the signal based on the pulse sequencing method.

In another exemplary embodiment, a voltage source inverter system is provided for controlling an AC motor. The voltage source inverter system is configured to operate with a modulation index ($M_i$) and includes a switch network comprising first, second, and third pairs of switches, and a controller coupled to the switch network. The first, second and third pairs of switches are coupled in parallel to one another and configured to couple in parallel with respect to a power source. The switch network is configured to produce a voltage in response to a signal, and the voltage drives the AC motor. The controller is configured to select a pulse sequencing method based on the modulation index ($M_i$) and further configured to produce the signal based on the pulse sequencing method. The pulse sequencing method results in no more than one switch of the first, second, and third pairs of switches being closed at an instant.

DESCRIPTION OF THE DRAWINGS

The present invention will hereinafter be described in conjunction with the following drawing figures, wherein like numerals denote like elements.

FIGS. 4-7 are examples of pulse sequencing methods for sector one shown in of FIG. 3;

FIG. 9 is a summary table of vector sequences for different switching methods;

FIG. 10 is a graphical representation of the harmonic flux trajectories shown in FIG. 8 in the d-axis;

FIG. 11 is a graphical representation of the harmonic flux trajectories shown in FIG. 8 in the q-axis;

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
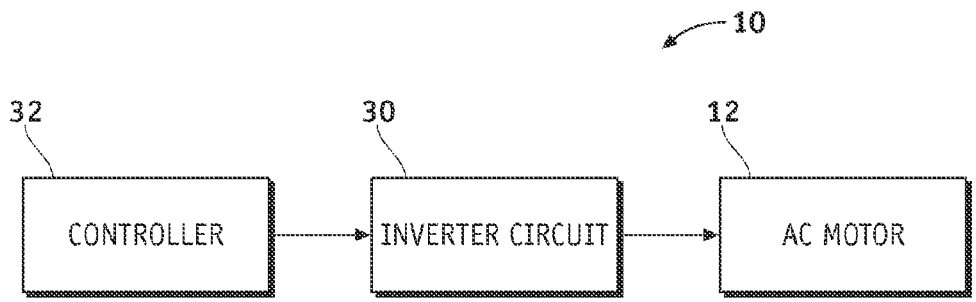
FIG. 1 is a block diagram of a voltage source inverter system in accordance with an exemplary embodiment.

Referring to FIG. 1, a voltage source inverter system 10 is shown in accordance with an exemplary embodiment of the present invention. The voltage source inverter system 10 comprises a controller 32, an inverter circuit 30 coupled to an output of the controller 32, and an alternating current (AC) motor 12 coupled to a first output of the inverter circuit 30. Generally, the controller 32 produces a Pulse Width Modulation (PWM) signal for controlling the switching action of the inverter circuit 30, although the controller can also receive the PWM signal from another source, for example, a modulator. In an exemplary embodiment, the controller 32 produces a discontinuous PWM (DPWM) signal having a single zero vector associated with each switching cycle of the inverter circuit 30. The inverter circuit 30 then converts the PWM signal to a modulated voltage waveform for operating the AC motor 12. The AC motor 12 may be a sinusoidally-wound AC motor (e.g., permanent magnet or induction) such as commonly used in automotive vehicles.

Figure 2:
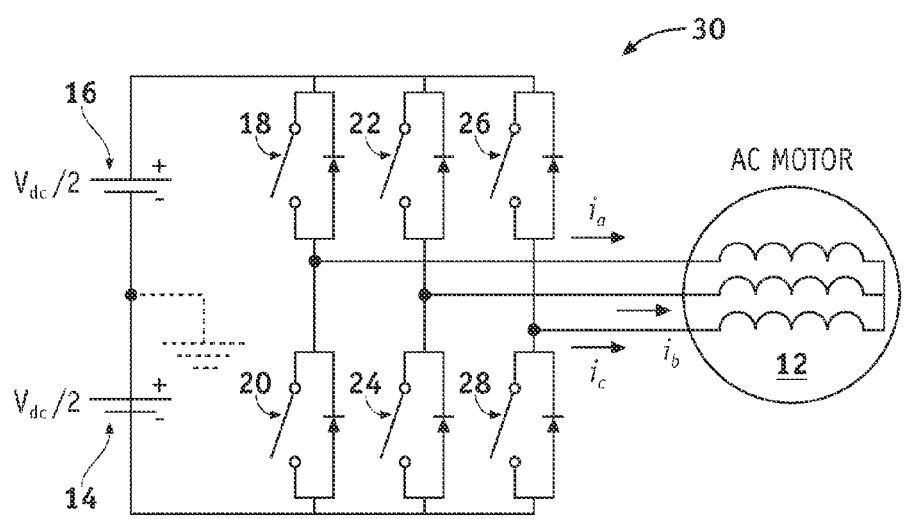
FIG. 2 is a schematic diagram of an inverter circuit of the voltage source inverter system shown in FIG. 1.

FIG. 2 depicts the inverter circuit 30 of FIG. 1 in greater detail. The inverter circuit 30 is a three-phase circuit coupled to the AC motor 12 and comprises voltage sources 14, 16 and a switch network having a first input coupled to the voltage sources 14, 16 and an output configured to couple to the AC motor 12. Although voltage sources 14, 16 are shown as a distributed DC link with two series sources (e.g., a first series source 14 and a second series source 16), a single voltage source may be used.

The switch network comprises three pairs of series switches with antiparallel diodes (i.e., antiparallel to each switch) corresponding to each of the phases. Each of the pairs of series switches comprises a first switch 18, 22, and 26 having a first terminal coupled to a positive electrode of the voltage source 16 and a second switch 20, 24, and 28 having a first terminal coupled to a negative electrode of the voltage source 16. The second switch 20, 24, and 28 has a second terminal coupled to a second terminal of the first switch 18, 22, and 26, respectively.

Figure 3:
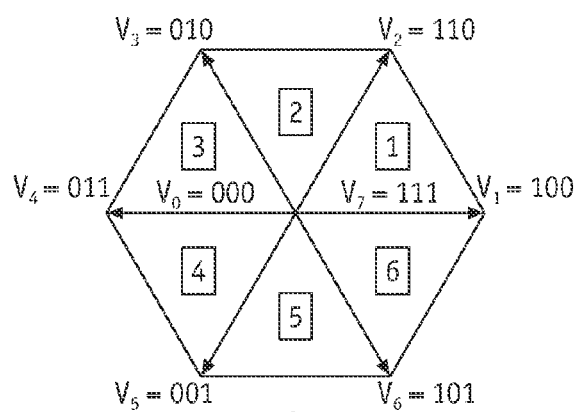
FIG. 3 is a space vector diagram useful for understanding the voltage source inverter system shown in FIG. 1.

FIG. 3 is a space vector diagram useful for understanding the voltage source inverter system 10 shown in FIG. 1. The inverter output voltages are represented by vectors (e.g., $V_1$, $V_2$, $V_3$, $V_4$, $V_5$, and $V_6$) corresponding to the switching for each phase (e.g., each of three phases) of the switching cycle. Each of the phases has two (2) states (e.g., corresponding to discrete one and zero). For example, $V_1$ is the voltage vector corresponding to a discrete one state (e.g., an upper switch "on" and a lower switch "off") of the first pair of switches 18, 20, and a discrete zero state (e.g., the upper switch "off" and the lower switch "on") of each of the second and third pairs of switches 22, 24 and 26, 28. $V_2$ is the voltage vector corresponding to a discrete one state of each of the first and second pairs of switches 18, 20 and 22, 24, and a discrete zero state of the third pairs of switches 26, 28. $V_3$ is the voltage vector corresponding to a discrete zero state of each of the first and third pairs of switches 18, 20 and 26, 28, and a discrete one state of the second pair of switches 22, 24. $V_4$ is the voltage vector corresponding to a discrete zero state of the first pair of switches 18, 20, and a discrete one state of each of the second and third pairs of switches 22, 24 and 26, 28. $V_5$ is the voltage vector corresponding to a discrete zero state of each of the first and second pairs of switches 18, 20 and 22, 24, and a discrete one state of the third pair of switches. $V_6$ is the voltage vector corresponding to a discrete one state of each of the first and third pairs of switches 18, 20 and 26, 28, and a discrete zero state of the second pair of switches 22, 24. A zero or "null" vector (e.g., at the center of the graphs) corresponds to either a discrete one state for each of the pairs of switches 18, 20, 22, 24, and 26, 28 (zero vector $V_7$) or a discrete zero state for each of the pairs of switches 18, 20, 22, 24, and 26, 28 (zero vector $V_0$).

The space vector diagram is further divided into six sectors, represented by the numbers within the squares. Sector one is bounded by the $V_1$ vector and the $V_2$ vector. Sector two is bounded by the $V_2$ vector and the $V_3$ vector. Sector three is bounded by the $V_3$ vector and the $V_4$ vector. Sector four is bounded by the $V_4$ vector and the $V_5$ vector. Sector five is bounded by the $V_5$ vector and the $V_6$ vector. Sector six is bounded by the $V_6$ vector and the $V_1$ vector. The six sectors correspond to a fundamental cycle of the inverter circuit and map the available output voltage as a function of electrical position. The space vector diagram is useful to represent the macroscopic phase leg duty cycles of the respective PWM method.

Once the duty cycles of the active and null space vectors are determined, the sequencing within each PWM cycle can be accomplished. Although numerous sequences are possible, an exemplary embodiment of the present invention utilizes one of four possible sequences within each PWM cycle. The four possible sequences are determined based on the three following considerations: 1) only one switch is switched at a time; 2) the sequence is symmetrical with respect to the beginning and end; and 3) one of the switches is not switched during the cycle.

FIGS. 4-7 illustrate the four exemplary pulse sequencing methods for sector one. Particularly, FIG. 4 shows the exemplary pulse sequencing method for the $V_0$ Active Center vector sequence for sector one, which includes the vector sequence 0-1-2-2-1-0. FIG. 5 shows an exemplary pulse sequencing method for the $V_7$ Null Center vector sequence for sector one, which includes the vector sequence 1-2-7-7-2-1. FIG. 6 shows an exemplary pulse sequencing method for the $V_0$ Null Center vector sequence for sector one, which includes the vector sequence 2-1-0-0-1-2. FIG. 7 shows an exemplary pulse sequencing method for the $V_7$ Active Center vector sequence for sector one, which includes the vector sequence 7-2-1-1-2-7. As indicated by the label, the $V_0$ Active Center sequence in FIG. 4 utilizes the $V_0$ null vector, active vectors in the center portion of the sequence, and null vectors are on each end. Conversely, the label for the $V_7$ Null Center sequence in FIG. 5 indicates that the sequence utilizes the $V_7$ null vector and two null vectors in the center portion of the sequence.

A typical method of sequencing the pulses within each PWM period comprises changing position of only one switch at each instant. For example, in sector one, the sequence of vectors is 1-2-7-7-2-1, while the sequence is reversed in sector two as 0-3-2-2-3-0. In odd numbered sectors, the $V_7$ Null Center sequence is employed, while the $V_0$ Active Center sequence is employed in even numbered sectors. In another embodiment, the sequences can be inverted such that the $V_7$ Active Center and $V_0$ Null Center sequences are employed. Without regard to which zero vector (or PWM method) is employed, the $V_0$ Active Center-$V_7$ Null Center pair or the $V_0$ Null Center-$V_7$ Active Center pair is typically regarded as a traditional sequencing for the pulses because these pairs naturally follow the analog equivalent of the digitally derived and implemented DPWM method. Use of the $V_0$ Active Center-$V_7$ Null Center pair is referred to herein as a Regular Positive Logic (RPL) method. The inverse of the $V_0$ Active Center-$V_7$ Null Center pair (or RPL pair) is the $V_0$ Null Center-$V_7$ Active Center pair, and its operation is substantially similar to the RPL pair.

Because a minimum of two sequences are used over a fundamental cycle, it is possible to center the active vectors or center the null vectors within a switching cycle. The use of the $V_0$ Active Center-$V_7$ Active Center pair is referred to herein as the Center Active Vector (CAV) method, and the use of the $V_0$ Null Center-$V_7$ Null Center pair is referred to herein as the Center Null Vector (CNV) method. While these pulse sequences are referenced with respect to the DPWM2 method, the pulse sequencing may be applicable to all DPWM, as well as continuous PWM, because discontinuous PWM methods differ in the location of the clamped output position (e.g., the location of the 60° clamped segment).

Figure 8:
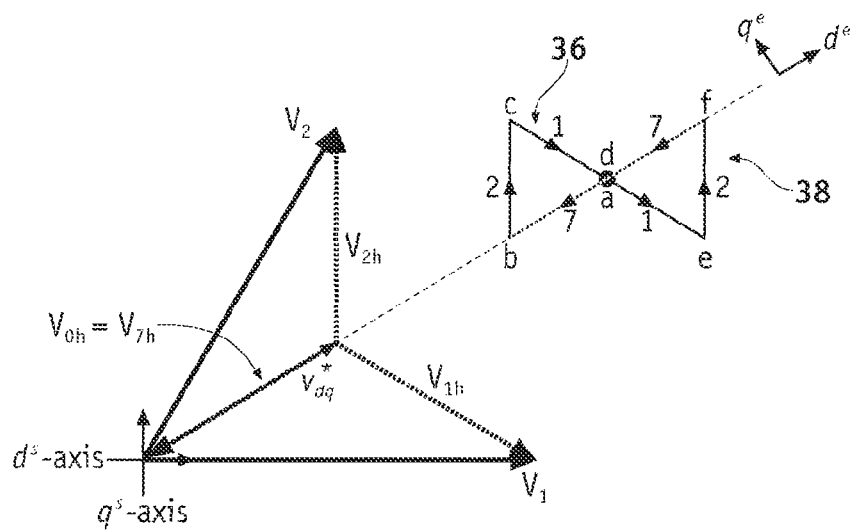
FIG. 8 is a graphical representation of the switching sequence for sector one shown in FIG. 3 using the CAV switching method.

FIG. 8 is a graphical representation of the switching sequence for sector one shown in FIG. 3 using the CAV method illustrating harmonic flux trajectories for sector one. One approach to comprehending the switching frequency harmonic properties of a particular PWM switching sequence is using a vector space representation. The commanded output voltage vector is represented by $v_{dq}^*$. The actual applied output voltage ($v_{dq}$) may be represented by $$v_{dq} = \bar{v}_{dq} + \tilde{v}_{dq} \quad \text{(eq 1)},$$

where $\tilde{v}_{dq} = v_{dq}^*$ is an average voltage applied during the switching period, and $\tilde{v}_{dq}$ is an alternating current (AC) component resulting from the PWM action. The AC component ($\tilde{v}_{dq}$), which is a source of current harmonics, is determined from $$\tilde{v}_{dq} = v_{dq} - \bar{v}_{dq} \quad \text{(eq. 2)}.$$

The AC voltage comprises the harmonic voltage vectors generated during each state of the PWM pulse sequence. For example, $$V_{1h} = V_1 - \bar{v}_{dq} \quad \text{(eq. 3)},$$

where $V_{1h}$ is the harmonic voltage associated with the first active state and $V_1$ is the inverter output voltage associated with the first active state.

As shown in FIG. 8, the harmonic voltage vectors ($V_{1h}$, $V_{2h}$, $V_{0h}$, and $V_{7h}$) cause the inverter output voltage to deviate from the commanded voltage vector ($V_{dq}^*$) within the switching period. Harmonic voltage vectors are space and modulation index dependent. Along with the harmonic voltage vectors, the duty cycles of the active inverter states, and the partitioning of the zero vector or vectors, determine harmonic current trajectories. Because the carrier frequency model of a motor load can be approximated by an inductance, conceptual harmonic flux trajectories (e.g., based on a time integral of the harmonic voltage vectors) can be used to determine the pulse positioning impact upon current sampling. The harmonic flux and harmonic current differ in amplitude and are related through the system parameters.

FIG. 9 is a summary table of vector sequences for different switching methods. Vector sequences are provided for each of the sectors of the space vector diagram shown in FIG. 3 and for each of the RPL, CAV, and CNV methods. Referring to FIGS. 8 and 9, the switching sequence employed using the CAV method for sector one is $V_7$-$V_2$-$V_1$-$V_1$-$V_2$-$V_7$ (or simplified to 7-2-1-1-2-7). The system is subjected to a harmonic flux trajectory that follows a path along points labeled a-b-c-d-e-f-g. For the CNV method, the switching sequence within sector one is 1-2-7-7-2-1 and the corresponding harmonic flux trajectory follows a path along points labeled g-e-f-a-b-c-d. From a spatial prospective, substantially identical harmonic flux triangles 36, 38 are formed that differ in the direction that the harmonic flux triangles 36, 38 are traversed.

The vector sequences for the RPL and CNV methods are the same for the odd numbered sectors, and the RPL and CAV methods are the same for the even numbered sectors. Because the harmonic flux triangles 36, 38 are identical for either switching sequence, the overall harmonic distortion is independent of the employed switching sequence.

FIG. 10 is a graphical representation of the harmonic flux trajectories 40, 42 using the CNV and CAV methods, respectively, shown in FIG. 8 in the d-axis. FIG. 11 is a graphical representation of harmonic flux trajectories 44, 46 using the CNV and CAV methods, respectively, shown in FIG. 8 in the q-axis. The harmonic voltage vectors cause the phase currents to deviate (e.g., via the harmonic flux trajectory) from desired values. The harmonic flux trajectories 40, 42, 44, 46 are shown in the synchronous reference frame with the synchronous reference frame attached to the commanded voltage vector, as shown in FIG. 8, although the location of the synchronous reference frame may be varied. The harmonic fluxes simultaneously have a value of zero in the d- and q-axes at a beginning (e.g., at a switching cycle time of about zero), a middle (e.g., at a switching cycle time of about 0.5), and an end (e.g., at a switching cycle time of about one) of each PWM cycle. If the phase currents are sampled at the beginning, middle or end of each PWM cycle, the sampled values may be undistorted and thus, match the actual average value of the phase current over the PWM cycle.

In conventional practice, the sampling instant may be adjusted to coincide with one of the zero value occurrences of the harmonic flux. However, the actual switching instant is not necessarily constant and may shift in time and manifest as if the sampling instant is in error (e.g., a measurement error). The actual switching instant is generally a function of the necessary inverter dead-time. The dead-time is selected to prevent simultaneous closing of both switches in a phase leg. This dead-time is typically chosen to be sufficiently large to accommodate variability in the switching times, across a predetermined temperature range and manufacturing tolerance, of both the inverter switches and associated gate driver circuitry. Additionally, the harmonic flux trajectory is a function of all three inverter phases. While a current regulator can adjust for steady-state differences resulting from the effect of the switching time on the average output voltage, the current regulator does not adjust for a relative movement between the actual switching and sampling times. The switching sequence thus influences the measurement error in the sampled phase currents.

This measurement error may be influenced by many factors including, but not necessarily limited to, the modulation index and angular position of the commanded output voltage vector. Additionally, the degree of time shift (e.g., delayed or advanced) of the sampling instant with respect to the switching instant influences the measurement error. For example, if the CAV method is employed and the commanded current is entirely in the q-axis (e.g., with reference to FIG. 8), the measurement error is insignificant or zero so long as the sampling instant is within about twenty-percent (20%) of the beginning of the PMW cycle. If a current is commanded in the d-axis, a shift in the sampling instant with respect to the switching instant produces an error in the measured current, regardless of which switching method (e.g., CNV or CAV method) is used. Because the sequences associated with the RPL method is a composite of both the CNV and CAV methods, the average error of the RPL method, on a fundamental basis, can be represented by the average error between the CAV and CNV methods for a given set of operating conditions.

The harmonic flux ($\lambda^s_h$) in the stationary reference frame, indicated by superscript s, which causes the measurement error, is determined from $$\lambda^s_h(v^*_{dq}, t_{samp}) = \int_0^{t_{samp}} (V_k - V^*_{dq}) dt, \quad \text{(eq. 4)}$$

where $V_k$ is an inverter output voltage vector in the kth state of the switching sequence, and $t_{samp}$ is a time at which the current is sampled. The harmonic flux can be transformed to the synchronous frame, indicated by superscript e. The error in the measured currents is determined from $$\text{Error} = k \cdot [\lambda_h^e]^T \cdot [i_{dq}^*] \qquad \text{(eq. 5)},$$

where k is a factor providing a relationship between the harmonic flux and the commanded current and is dependent on system parameters.

Figure 12:
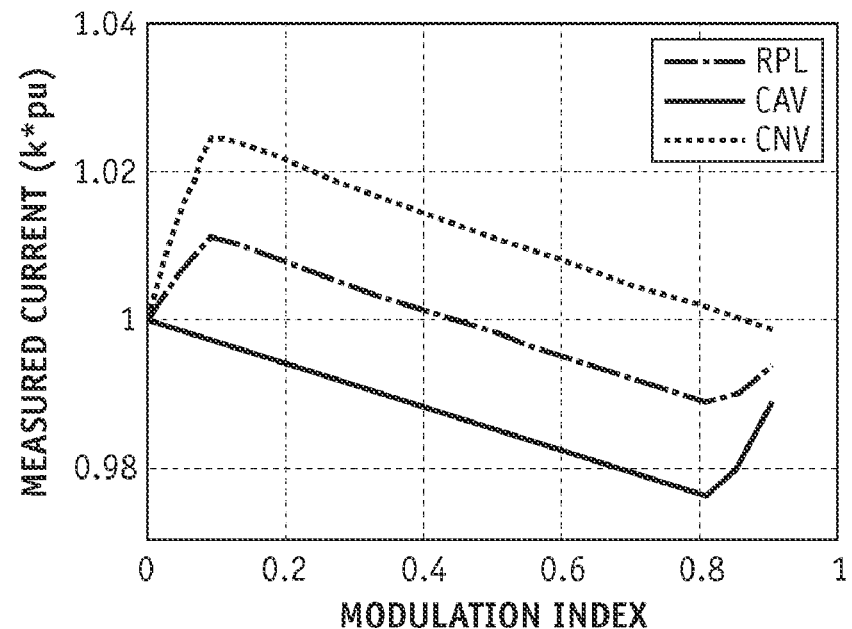
FIG. 12 is a graph illustrating measured currents for the RPL, CAV, and CNV switching methods in relation to the modulation index.

FIG. 12 is a graph illustrating measured currents for the RPL, CAV, and CNV switching methods in relation to the modulation index in a linear range. The effect of the pulse sequence on the measurement error in current sampling can be explored through numeric calculations (e.g., using eqs. 4 and 5) for typical operating conditions. For example, one typical operating condition has a commanded current with a beta angle of about forty-five degrees (45°) with a power factor of about 0.866 lagging and a sampling instant advanced about five-percent (5%) from the beginning of the PWM cycle.

For a sampling advance of about five-percent (5%), the CNV method generally yields a measured current that is larger than the actual current. Under conventional operation, the current regulator will reduce the actual current such that the measured current matches the commanded current. For an electric motor, this implies that the actual motor currents will be reduced and a loss of torque will result. In the case of the CAV method, the measured current is consistently smaller than the actual current. Under conventional operation, the current regulator will increase the actual system current and the produced torque will be larger than requested. The RPL method yields a measured current on a fundamental basis that is between the CAV and CNV methods.

Figure 13:
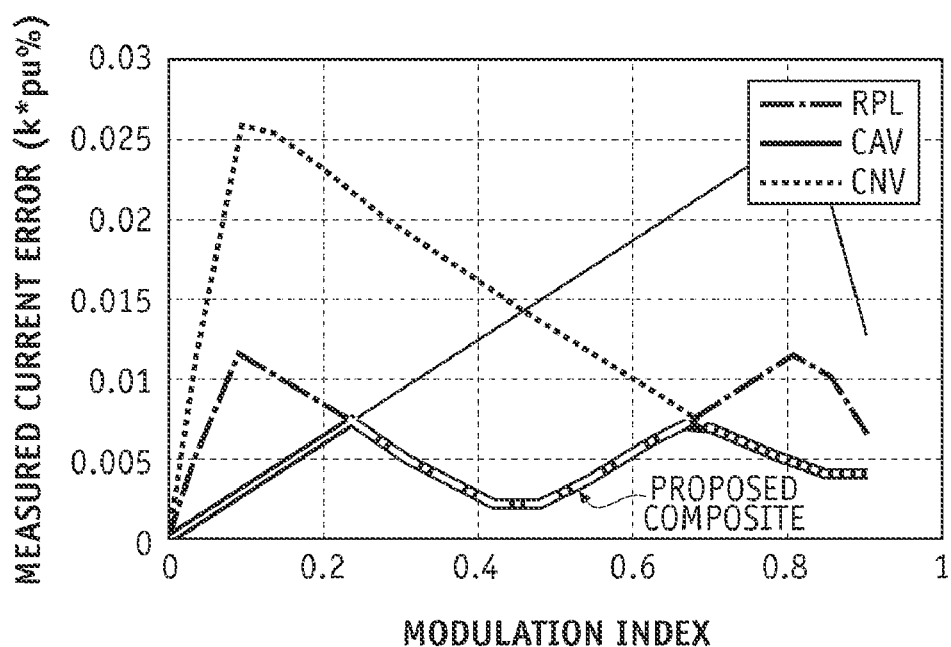
FIG. 13 is a graph illustrating measured current errors for the RPL, CAV, and CNV switching methods in relation to the modulation index.

FIG. 13 is a graph illustrating absolute values of measured current errors for the RPL, CAV, and CNV switching methods, respectively, in relation to the modulation index. At low modulation indices, the CAV method produces the lowest current measurement error. At the higher modulation indices, the CNV method produces the lowest current measurement error. A composite error (proposed composite) is minimized by selecting the pulse sequence method with the least error at each modulation index.

Because the current error is a function of the harmonic flux, the current error is independent of the actual value of the commanded current. In general, when the commanded current is small, the error resulting from a non-ideal sampling comprises a larger percentage error, and the percentage error will be smaller for larger values of commanded current.

To minimize the current measurement error resulting from the time shift between the current sampling instant and one of the zero-value occurrences of the harmonic flux during the switching cycle, a PWM pulse position scheduling method is proposed. Referring to FIG. 1, the controller 32 employs one of the RPL, CAV, and CNV methods to minimize current sampling errors in electric motors. Based on the measured currents error associated with each of the RPL, CAV, and CNV methods, transitions points associated with the modulation index can be selected.

In accordance with an exemplary embodiment, the controller 32 employs the pulse position sequences associated with the CAV method at low modulation indices. Once the modulation index increases above a first predetermined value, $M_{i\_mid}$, the controller 32 employs the pulse position sequences associated with the RPL method. Once the modulation index increases above a second predetermined value, $M_{i\_high}$, the controller 32 employs the pulse position sequences associated with the CNV method. The transition points or regions, which may have some hysteresis associated therewith, provided by $M_{i\_mid}$ and $M_{i\_high}$ can be determined and stored in a look-up table for use by the system controller. These transition points provided by $M_{i\_mid}$ and $M_{i\_high}$ can also be variables that depend upon the particular operating condition (e.g., current) or may be constant values for a given system.

Varying the PWM pulse position sequencing method over the operating range of the AC motor by selecting the PWM pulse position sequencing method minimizes current sampling error and improves measured current accuracy. The torque accuracy of the AC motor is also improved, and torque error is generally improved, particularly under light load conditions. Additionally, by varying the PWM pulse position sequencing method to minimize current sampling error, the sensitivity of the system to manufacturing tolerances is reduced.

Figure 14:
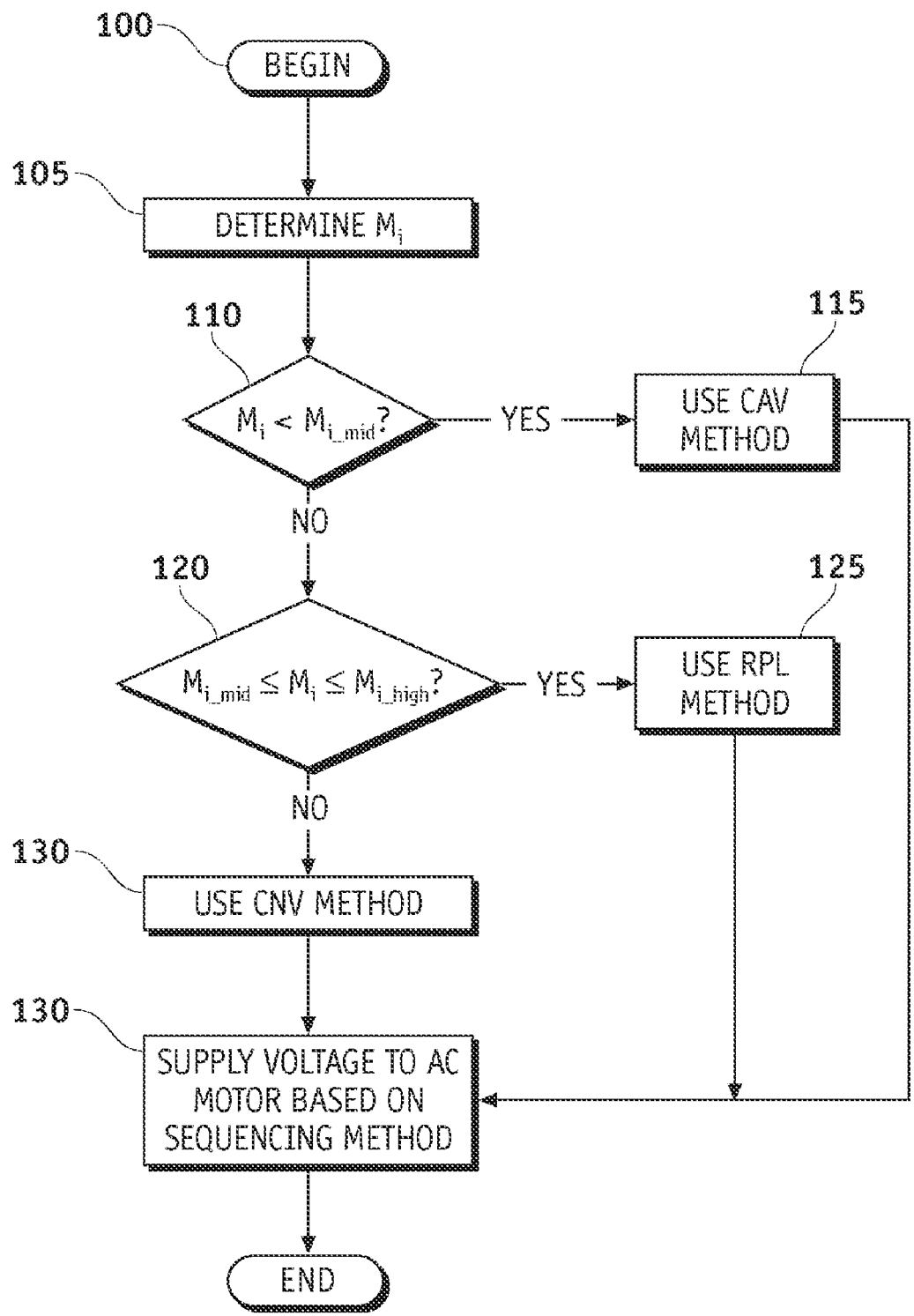
FIG. 14 is a flow diagram of a method for controlling an AC motor in accordance with an exemplary embodiment.

FIG. 14 is a flow diagram of a method 100 for controlling an AC motor in accordance with an exemplary embodiment. In particular, FIG. 14 details a process for determining an appropriate PWM pulse sequencing method that minimizes the current sampling error of a voltage source inverter for driving an AC motor. Referring to FIGS. 1 and 14, the modulation index ($M_i$) of the voltage source inverter is determined, as indicated at step 105. For example, the controller 32 may monitor or determine the modulation index ($M_i$) of the inverter circuit 30 during operation of the AC motor 12. The first and second predetermined modulation indices ($M_{i\_mid}$ and $M_{i\_high}$) may be generated based on a variety of operating conditions (e.g., current) and indicate transition points or regions from one PWM pulse sequencing method to another to reduce the current sampling error. These modulation indices ($M_{i\_mid}$ and $M_{i\_high}$) may be stored in a look-up table in the controller 32. The PWM pulse sequencing methods preferably include the CAV, RPL, and CNV methods.

A determination is made as to if $M_i < M_{i\_mid}$, as indicated at step 110. If $M_i < M_{i\_mid}$, then the CAV sequencing method is used, as indicated at step 115. If the modulation index ($M_i$) is not less than the first predetermined modulation index ($M_{i\_mid}$), then a determination is made as to if $M_{i\_mid} \leq M_i \leq M_{i\_high}$, as indicated at step 120. If $M_{i\_mid} \leq M_i \leq M_{i\_high}$, then the RPL sequencing method is used, as indicated at step 125. If the modulation index ($M_i$) is greater than the second predetermined modulation index ($M_{i\_high}$), then the CNV method is used, as indicated at step 130. A voltage is provided to the AC motor based on the selected pulse sequencing method, as indicated at step 135.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for controlling an alternating current (AC) motor via an inverter, comprising:
   selecting a pulse sequencing method based on a modulation index ($M_i$) of the inverter; and providing a voltage to the AC motor based on the pulse sequencing method, wherein the selecting step comprises selecting the pulse sequencing method to minimize a current sampling error of the inverter based on the modulation index ($M_i$).

2. The method according to claim 1, wherein the selecting step comprises selecting the pulse sequencing method from a group consisting of a Center Active Vector (CAV) sequencing method, a Regular Positive Logic (RPL) sequencing method, and a Center Null Vector (CNV) sequencing method.

3. The method according to claim 2, wherein the selecting step further comprises:
selecting the CAV sequencing method if $M_i <$ a first modulation index ($M_{i\_mid}$) selecting the RPL sequencing method if $M_{i\_mid} \leq M_i \leq$ a second modulation index ($M_{i\_high}$), wherein $M_{i\_mid} < M_{i\_high}$; and
selecting the CNV sequencing method if $M_i > M_{i\_high}$.

4. The method according to claim 1, wherein the inverter has a current sampling error, a first predetermined modulation index ($M_{i\_mid}$), and a second predetermined modulation index ($M_{i\_high}$), $M_{i\_mid} < M_{i\_high}$, $M_{i\_mid}$ indicating a first transition to minimize the current sampling error, $M_{i\_high}$ indicating a second transition to minimize the current sampling error; and
wherein the selecting step comprises comparing $M_i$ with respect to $M_{i\_mid}$ and $M_{i\_high}$.

5. The method according to claim 1, farther comprising supplying the inverter with a discontinuous pulse width modulation (DPWM) signal based on the pulse sequencing method.

6. The method according to claim 5, wherein the inverter comprises a circuit comprising first, second, and third pairs of series connected switches, wherein the first, second and third pairs of switches are connected in parallel to one another with respect to a power source; and
wherein the step of supplying comprises controlling the first, second, and third pairs of switches in response to the DPWM signal.

7. A system for controlling an AC motor, the system comprising:
an inverter configured to couple to the AC motor, the inverter having a modulation index ($M_i$) and comprising a switch network configured to provide a voltage to the AC motor in response to a signal, the voltage driving the AC motor; and
a controller coupled to the inverter, the controller configured to select a pulse sequencing method based on the modulation index ($M_i$) and further configured to produce the signal based on the pulse sequencing method, wherein the controller is farther configured to determine a current sampling error of the inverter, and to select the pulse sequencing method to minimize the current sampling error.

8. The system according to claim 7, wherein the controller is further configured to select the pulse sequencing method based on a comparison of $M_i$ with at least one of a first predetermined modulation index ($M_{i\_mid}$) and a second predetermined modulation index ($M_{i\_high}$), $M_{i\_mid}$ indicating a first transition to minimize the current sampling error, and $M_{i\_high}$ indicating a second transition to minimize the current sampling error.

9. The system according to claim 7, wherein the signal is a PWM signal, and wherein the current sampling error is based on a harmonic flux resulting from the PWM signal.

10. The system according to claim 7, wherein the controller is further configured to:
select a Center Active Vector (CAV) sequencing method if $M_i <$ a first modulation index ($M_{i\_mid}$);
select a Regular Positive Logic (RPL) sequencing method if $M_{i\_mid} \leq M_i \leq$ a second modulation index ($M_{i\_high}$), wherein $M_{i\_mid} < M_{i\_high}$; and
select a Center Null Vector (CNV) sequencing method if $M_i > M_{i\_high}$.

11. The system according to claim 7, wherein the controller is further configured to select the pulse sequencing method from a group consisting of a CAV sequencing method, an RPL sequencing method, and a CNV sequencing method.

12. The system according to claim 7, wherein the signal is a discontinuous pulse width modulation (DPWM) signal.

13. The system according to claim 7, wherein the switch network comprises first, second, and third pairs of series-coupled switches, wherein the first, second, and third pairs of switches are connected in parallel to one another with respect to a power source.

14. A voltage source inverter system for controlling an AC motor, the voltage source inverter system configured to operate with a modulation index ($M_i$), the voltage source inverter system comprising:
a switch network comprising first, second, and third pairs of switches, wherein the first, second and third pairs of switches are coupled in parallel to one another and configured to couple in parallel with respect to a power source, the switch network configured to produce a voltage in response to a signal, the voltage driving the AC motor; and
a controller coupled to the switch network, the controller configured to select a pulse sequencing method based on the modulation index ($M_i$) and further configured to produce the signal based on the pulse sequencing method, and wherein the pulse sequencing method results in no more than one switch of the first, second, and third pairs of switches being closed at an instant.

15. The voltage source inverter system according to claim 14, wherein the voltage source inverter system has a current sampling error; and wherein the controller is further configured to select the pulse sequencing method to minimize the current sampling error.

16. The voltage source inverter system according to claim 14, wherein the controller is further configured to select the pulse sequencing method from a group consisting of a Center Active Vector (CAV) sequencing method, a Regular Positive Logic (RPL) sequencing method, and a Center Null Vector (CNV) sequencing method.

17. The voltage source inverter system according to claim 14, wherein the controller is further configured to:
select a CAV sequencing method if $M_i <$ a first modulation index ($M_{i\_mid}$) select a RPL sequencing method if $M_{i\_mid} \leq M_i \leq$ a second modulation index ($M_{i\_high}$), wherein $M_{i\_mid} < M_{i\_high}$; and
select a CNV sequencing method if $M_i > M_{i\_high}$.

18. The voltage source inverter system according to claim 17, wherein the voltage source inverter system has a current sampling error; and wherein $M_{i\_mid}$ indicates a first transition to minimize the current sampling error, and $M_{i\_high}$ indicates a second transition to minimize the current sampling error.

* * * * *